(12) United States Patent
Gleason et al.

(10) Patent No.: US 8,106,420 B2
(45) Date of Patent: Jan. 31, 2012

(54) LIGHT EMITTING DEVICE INCLUDING SEMICONDUCTOR NANOCRYSTALS

(75) Inventors: Karen K. Gleason, Cambridge, MA (US); Sreeram Vanddiraju, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 306 days.

(21) Appl. No.: 12/479,181

(22) Filed: Jun. 5, 2009

(65) Prior Publication Data

US 2010/0308369 A1 Dec. 9, 2010

(51) Int. Cl.
*H01L 33/00* (2010.01)
(52) U.S. Cl. ........ 257/103; 257/414; 257/440; 257/678; 257/680; 438/22; 438/28; 438/35; 438/46
(58) Field of Classification Search .......................... None
See application file for complete search history.

(56) References Cited

U.S. PATENT DOCUMENTS

| | | |
|---|---|---|
| 6,251,303 B1 | 6/2001 | Bawendi et al. |
| 6,322,901 B1 | 11/2001 | Bawendi et al. |
| 6,444,143 B2 | 9/2002 | Bawendi et al. |
| 6,576,291 B2 | 6/2003 | Bawendi et al. |
| 7,160,613 B2 | 1/2007 | Bawendi et al. |
| 7,190,870 B2 | 3/2007 | Sundar et al. |
| 7,253,452 B2 | 8/2007 | Steckel et al. |
| 7,332,211 B1 * | 2/2008 | Bulovic et al. ............... 428/206 |
| 2004/0023010 A1 | 2/2004 | Bulovic et al. |
| 2006/0196375 A1 | 9/2006 | Coe-Sullivan et al. |

FOREIGN PATENT DOCUMENTS
WO WO 2008/118534 10/2008

OTHER PUBLICATIONS

Adachi et al., Appl. Phys. Lett. 78, 1622 (2001).
Alivisatos A. P. Science 1996, 271, 933.
Anikeeva, P. O., et al. Nano Lett. 9, 2532 (2009).
Anikeeva, P. O., et al. Phys. Rev. B 78, 085434 (2008).
Anikeeva, P.O. et al. Nano Lett. 7, 2196-2200 (2007).
Armstrong et al., Thin Solid Films 2003, 445, 342.
Bolink, H.J., et al. Appl. Phys. Lett. 91 223501 (2007).
Bulovic et al., Semiconductors and Semimetals 64, 255 (2000).
Bulovic, V. et al., Nature 1996, 380, 29.
Caruge, J.-M., et al. Nano Lett. 6, 2991-2994 (2006).
Caruge, J.-M., et al. NaturePhotonics 2, 247-250 (2008).
Coe, S., et al. Nature 420, 800-803 (2002).
Colvin, V. L., et al. Nature 370, 354-357 (1994).
D'Andrade et al., MRS Fall Meeting, BB6.2 (2001).
Dabbousi et al., J. Phys. Chem. B 101, 9463 (1997).
Dirr et al., Jpn. J. Appl. Phys. 37, 1457 (1998).
G. Yu et al. Applied Physics Letters 73:111-113 (1998).
Gu, G. et al., Appl. Phys. Lett. 1996, 68, 2606-2608.
Hanif K. M., et al.; J. Am. Chem. Soc. 2002, 124, 11495.
Im et al., Adv. Mat. 2007, 19, 2863.
Im et al., Macromolecules 2007, 40, 6552.
Levy L., et al.; J. Phys. Chem. 1996, 100, 18322.

(Continued)

Primary Examiner — N. Drew Richards
Assistant Examiner — Kyoung Lee
(74) Attorney, Agent, or Firm — Steptoe & Johnson LLP

(57) ABSTRACT

A light emitting device can have a layered structure and include a plurality of semiconductor nanocrystals. The layers of the device can be covalently bonded to each other. The device can include continuous chain of covalent bonds extending from the first electrode to the second electrode.

47 Claims, 4 Drawing Sheets
(2 of 4 Drawing Sheet(s) Filed in Color)

OTHER PUBLICATIONS

Lock et al., *Macromolecules* 2006, 39, 5326.
Mikulec, F., et al.; *J. Am. Chem. Soc.* 2002, 122, 2532.
Mueller, A. H. et al. *Nano Lett.* 5, 1039-1044 (2005).
Norris D. J., et al.; *Nano Lett.* 2001, 1, 3.
Pradhan N., et al.; *J. Amer. Chem. Soc.* 2005, 127, 17586.
Pradhan N.; Peng X. *J. Amer. Chem. Soc.* 2007, 129, 3339.
Shim M.; Guyot-Sionnest P. *Nature* 2000, 407, 981.
Stouwdam, J.W. & Janssen R.A.J. *J. Mat. Chem.* 18, 1889-1894 (2008).
Thakar et al.; *Nano Lett.* 2007, 7, 3429.
Vaddiraju et a.l, *Adv. Funct. Mater.* 2008, 18, 1929.
Wang Y., et al.; *Solid State Comm.* 1991, 77, 33.
Yamasaki et al., Appl. Phys. Lett. 76, 1243 (2000).
Zhao, J. et al. *Nano Lett.* 6, 463-467 (2006).

* cited by examiner

LIGHT EMITTING DEVICE INCLUDING SEMICONDUCTOR NANOCRYSTALS

TECHNICAL FIELD

The present invention relates to light emitting devices including semiconductor nanocrystals.

BACKGROUND

Light-emitting devices can be used, for example, in displays (e.g., flat-panel displays), screens (e.g., computer screens), and other items that require illumination. Accordingly, the brightness of the light-emitting device is an important feature of the device. Also, low operating voltages and high efficiencies can improve the viability of producing emissive devices. In many applications, long device lifetime is desirable.

Light-emitting devices can release photons in response to excitation of an active component of the device. Emission can be stimulated by applying a voltage across the active component (e.g., an electroluminescent component) of the device. Some devices can be operated with a time-varying voltage, i.e., an alternating current; such devices can be referred to as alternating current thin-film electroluminescent (AC-TFEL) devices. The electroluminescent component can be a polymer, such as a conjugated organic polymer or a polymer containing electroluminescent moieties or layers of organic molecules. Typically, the emission can occur by radiative recombination of an excited charge between layers of a device. The emitted light has an emission profile that includes a maximum emission wavelength, and an emission intensity, measured in luminance (candelas/square meter ($cd/m^2$) or power flux ($W/m^2$)). The emission profile, and other physical characteristics of the device, can be altered by the electronic structure (e.g., energy gaps) of the material. For example, the brightness, range of color, efficiency, operating voltage, and operating half-lives of light-emitting devices can vary based on the structure of the device.

Today, many flat panel displays use liquid crystal displays (LCDs) which rely on a backlight and subtractive processing of light to produce a range of colors. Although the power requirements of LCDs are reasonably low (due to efficient backlighting), the subtractive process inherently limits light efficiency. The subtractive process also limits the darkest black that can be produced, and thus the contrast ratio. In contrast, organic light emitting diodes (OLEDs) can provide additive rather than subtractive displays. Blacks are blacker, and less power can be required as less light is lost due to absorption.

However, most organic light emitting diodes currently employed in displays (e.g., portable displays, such as those found in mobile phones and digital music players) can be sensitive to air and moisture. To address this issue, devices are typically embedded in polymer packaging to be employed in portable device displays.

SUMMARY

In general, a light emitting device can include a plurality of semiconductor nanocrystals. Semiconductor nanocrystals can be inorganic semiconductor particles, for example, 1-15 nm in diameter, optionally decorated with organic ligands. Nanocrystals can show strong quantum confinement effects that can be harnessed in designing bottom-up chemical approaches to create complex heterostructures with electronic and optical properties that are tunable with the size and composition of the nanocrystals.

Semiconductor nanocrystals can be used as an emissive material in a light emitting device. Because semiconductor nanocrystals can have narrow emission linewidths, can be photoluminescent efficient, and emission wavelength tunable, they can be a desirable emissive material. These optical properties of the nanocrystals themselves can be influenced by selection of nanocrystals having appropriate composition, size, shape, and structural configuration. Semiconductor nanocrystals can be dispersed in a liquid and are therefore compatible with deposition techniques such as spin-casting, drop-casting, dip coating, ink jet printing, microcontact printing or other methods.

A multilayer of semiconductor nanocrystals can be less than 3 microns thick, less than 2 microns thick, or less than 1 micron thick. Semiconductor nanocrystals can be dispersed in mild solvents (for example, water) that are compatible with other materials used in the device. A wide variety of substrates can thus be used, because the choice of substrate can be freed from constraints imposed by solubility and surface chemistry requirements.

An electroluminescent device can have a sandwich structure in which a first electrode, a first semiconductor layer, a second semiconductor layer, and a second electrode layer are stacked on an insulating substrate. An emissive material is also located between the electrodes. The emissive material can be one of the semiconductor materials or a distinct material chosen in part for its emissive properties (such as color). The emissive material may dispersed in one or more of the semiconductor layers, or can be present in a distinct emissive layer. The emissive material may be substantially the only material in the emissive layer (i.e., the emissive layer is a neat layer of emissive material) or the emissive material may be dispersed in a matrix material in the emissive layer. One disadvantage associated with the sandwich structure has been the difficulty of engineering layer composition to emit red, green and blue light side by side to produce a white-light and/or full color emission.

When semiconductor nanocrystals are included in an electroluminescent device, the device can produce light of a desired color or colors. Multiple devices that emit different colors of light can be easily produced side by side with little or no change to material processing conditions used in device fabrication.

Light emitting devices can include solution-deposited semiconductor nanocrystals and solution-deposited organic material. Such hybrid inorganic-organic light emitting devices (HLEDs) can exhibit long shelf lives and provide stable device luminance over extended operating times in air while unpackaged.

In one aspect, a light emitting device includes a first electrode and a second electrode spaced apart from the first electrode; a first charge transport material adjacent to the first electrode; a layer disposed between the first and second electrodes, the layer including a plurality of semiconductor nanocrystals; a first linking moiety having a first end covalently bonded to the first charge transport material and a second end coordinated to a semiconductor nanocrystal; and a second linking moiety having a first end coordinated to a semiconductor nanocrystal.

The first charge transport material, the first linking moiety, the semiconductor nanocrystal, and the second linking moiety together can provide a continuous chain of covalent bonds extending from the first electrode to the second electrode. The first linking moiety can provide a continuous chain of π-conjugated covalent bonds extending from the first electrode to the semiconductor nanocrystal. The second linking moiety can provide a continuous chain of π-conjugated covalent bonds extending from the semiconductor nanocrystal to the second electrode. The device can include a second charge transport material adjacent to the second electrode. The second linking moiety can have a second end covalently bonded to the second charge transport material.

The first linking moiety can include a nanocrystal-coordinating region. The second linking moiety can include a nanocrystal-coordinating region. The nanocrystal-coordinating regions of the first linking moiety and the second linking moiety, individually, can include

-X-L- where X is O, S, S=O, $SO_2$, Se, Se=O, N, N=O, P, P=O, As, or As=O.

L can be an aryl group, a heteroaryl group, or a straight or branched $C_{2-12}$ hydrocarbon chain optionally containing at least one double bond, at least one triple bond, or at least one double bond and one triple bond; wherein the aryl group, the heteroaryl group, or the hydrocarbon chain can be optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, monocyclic aryl, 5-6 membered heteroaryl, $C_{1-4}$ alkylcarbonyloxy, $C_{1-4}$ alkyloxycarbonyl, $C_{1-4}$ alkylcarbonyl, or formyl. The hydrocarbon chain can be optionally interrupted by —O—, —S—, —N($R^e$)—, —N($R^e$)—C(O)—O—, —O—C(O)—N($R^e$)—, —N($R^e$)—C(O)—N($R^f$)—, —O—C(O)—O—, —P($R^e$)—, or —P(O)($R^e$)—.

Each of $R^e$ and $R^f$, independently, can be hydrogen, alkyl, alkenyl, alkynyl, alkoxy, hydroxylalkyl, hydroxyl, or haloalkyl.

In some cases, X can be S, and L is —Ar—C(O)—. X can be S, and L can be

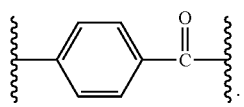

The nanocrystal-coordinating region of the first linking moiety can be chemically identical to the nanocrystal-coordinating region of the second linking moiety.

The first charge transport material can include a copolymer including EDOT monomer units. The first charge transport material can include poly(EDOT-co-TAA).

The first linking moiety can include —$NR^a$—Ar—$NR^a$—, wherein Ar is an optionally substituted aryl or heteroaryl group, and each $R^a$, independently, is hydrogen, alkyl, alkenyl, alkynyl, alkoxy, hydroxylalkyl, hydroxyl, haloalkyl, aryl, or heteroaryl. The first linking moiety can include

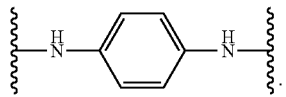

The second linking moiety can include a metal-coordinating region. The second electrode can include a metal, and the metal-coordinating region of the second linking moiety can be coordinated to the metal. The metal-coordinating region of the second linking moiety can include —OH.

In another aspect, a method of generating light includes providing a device including a first electrode and a second electrode spaced apart from the first electrode; a first charge transport material adjacent to the first electrode; a layer disposed between the first and second electrodes, the layer including a plurality of semiconductor nanocrystals; a first linking moiety having a first end covalently bonded to the first charge transport material and a second end coordinated to a semiconductor nanocrystal; and a second linking moiety having a first end coordinated to a semiconductor nanocrystal. The method also includes applying a light-generating potential across the first electrode and the second electrode.

In another aspect, a method of making a light emitting device includes depositing a first charge transport material over a first electrode; depositing a plurality of semiconductor nanocrystals over the first charge transport material, the semiconductor nanocrystals including a coordinating ligand having a nanocrystal-coordinating region and a first reactive functional group; and depositing a second electrode over the plurality of semiconductor nanocrystals.

Depositing the first charge transport material can include oCVD. The method can include modifying the first charge transport material with a spacer moiety having a second reactive functional group. Modifying the first charge transport material can include forming a covalent bond between the first charge transport material and the spacer moiety. The first reactive functional group and the second reactive functional group can react, thereby forming a covalent bond between the spacer moiety and the coordinating ligand.

The semiconductor nanocrystals can include a coordinating ligand having a metal-coordinating region. Depositing the second electrode can include depositing a plurality of colloidal metal nanoparticles.

Other features, objects, and advantages of the invention will be apparent from the description and drawings, and from the claims.

DESCRIPTION OF DRAWINGS

The patent or application file contains at least one drawing executed in color. Copies of this patent or patent application publication with color drawing(s) will be provided by the U.S. Patent and Trademark Office upon request and payment of the necessary fee.

DETAILED DESCRIPTION

A light emitting device can include two or more layers separating two electrodes of the device. The layers can include a dielectric layer interposed between the electrodes and an emissive layer. When a voltage is applied across the electrodes, excitons (excited state electron/hole ($e^-$/$h^+$) pairs) can be formed on an electroluminescent material. The excitons can then recombine to emit light. The electroluminescent material can be selected for its emissive properties, such as emission wavelength or linewidth. The electroluminescent material can be a wide band gap material.

Figure 1:
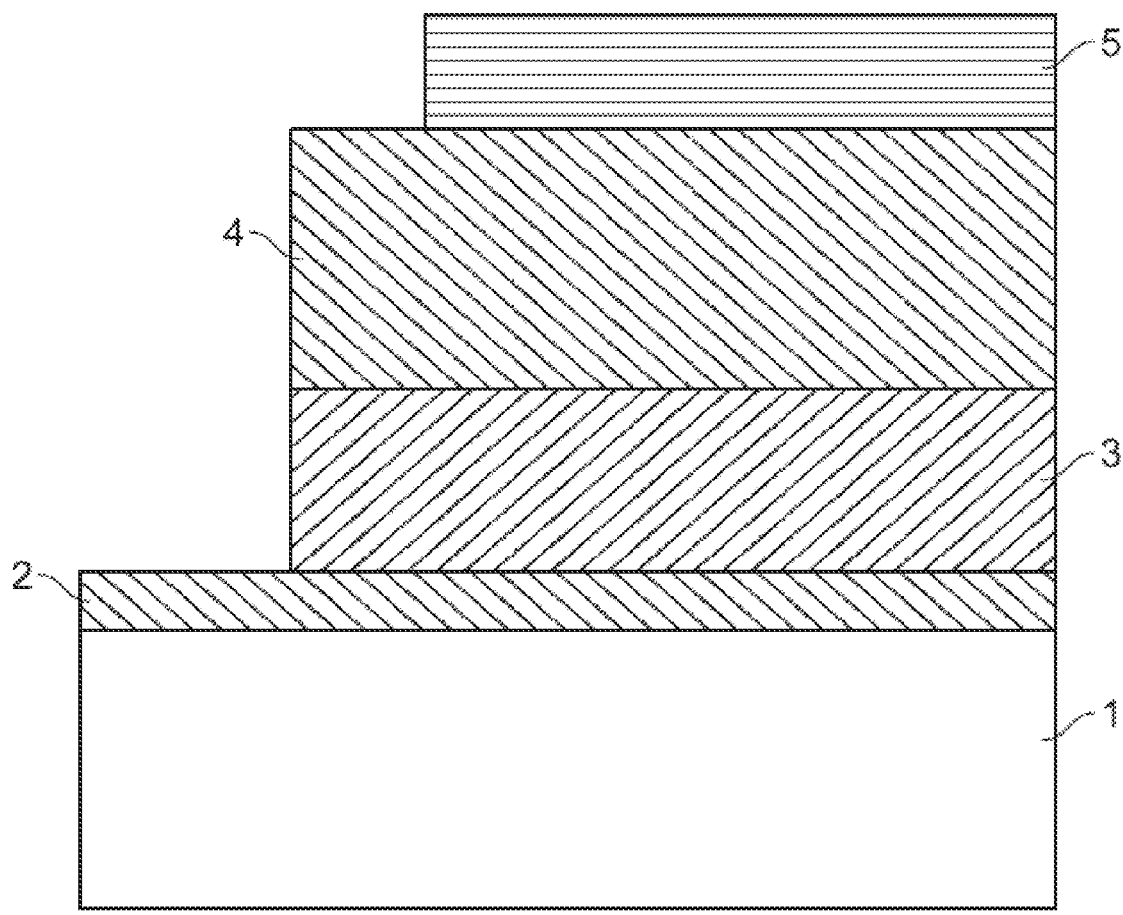
FIG. 1 is a schematic drawing depicting a light-emitting device.

A light emitting device can have a structure such as shown in FIG. 1, in which a first electrode 2, a first layer 3 in contact with the electrode 2, a second layer 4 in contact with the layer 3, and a second electrode 5 in contact with the second layer 4. First layer 3 and second layer 4 can each be a semiconductor layer, capable of functioning as an insulating layer or a charge transport layer, such as a hole transport layer, or electron transport layer. One of the electrodes of the structure is in contact with a substrate 1. Each electrode can contact a power supply to provide a voltage across the structure. Electroluminescence can be produced by the emissive layer of the heterostructure when a voltage is applied across the heterostructure. A separate emissive layer (not shown in FIG. 1) can be included between the in the device, for example between first layer 3 and second layer 4. The separate emissive layer can include a semiconductor nanocrystal.

Figure 2:
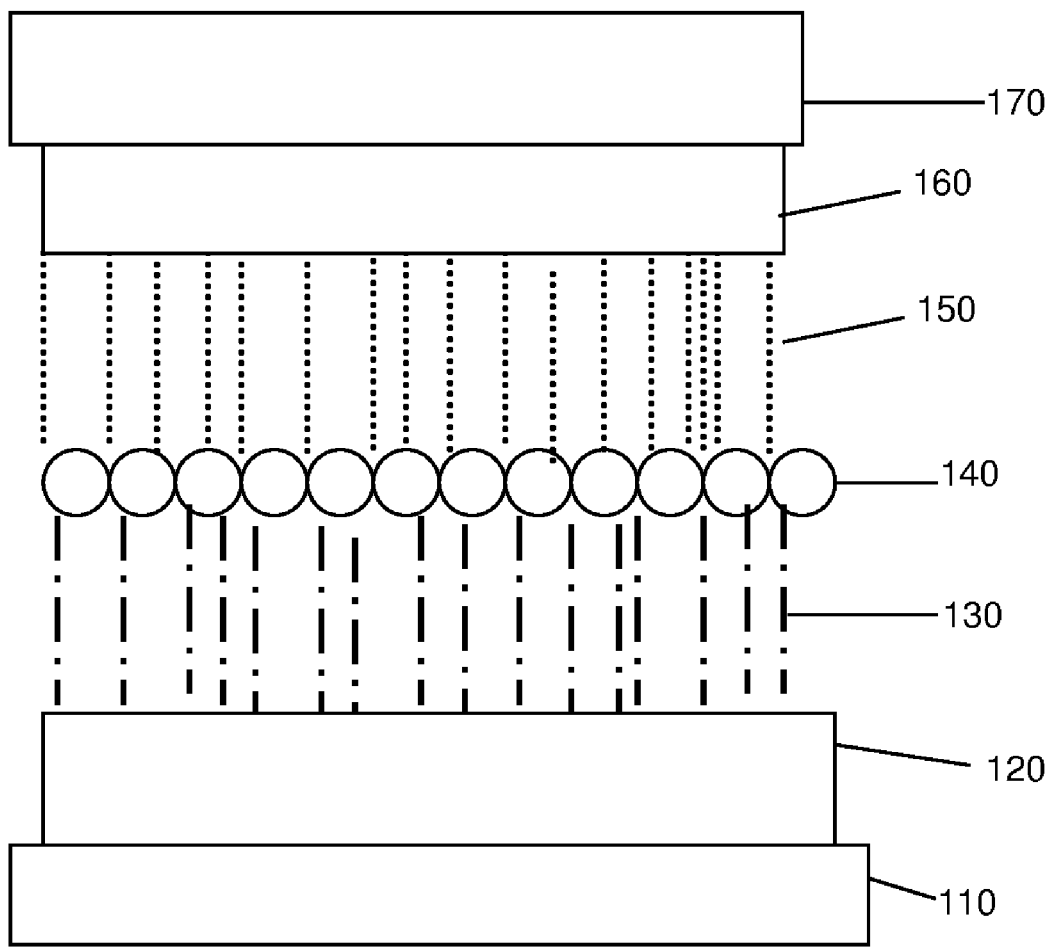
FIG. 2 is a schematic drawing depicting a light-emitting device.

FIG. 2 shows a schematic diagram of a light emitting device. First electrode 110 supports first charge transport material 120. First linking moiety 130 is covalently bound to first charge transport material 120 at one end and coordinated to semiconductor nanocrystals 140 at another end. Second linking moiety 150 is coordinated to semiconductor nanocrystals 140 at one end, and covalently bound to optional second charge transport material 160 at another end. Second electrode 170 completes the structure. When second charge transport material 160 is not present, second linking moiety 150 can be coordinated to metal atoms of second electrode 170. Portions of first linking moiety 130 and second linking moiety 150 may be identical, e.g., when the first and second linking moieties are both derived from a single nanocrystal coordinating ligand.

The substrate can be opaque or transparent. A transparent substrate can be used to in the manufacture of a transparent LED. See, for example, Bulovic, V. et al., *Nature* 1996, 380, 29; and Gu, G. et al., *Appl. Phys. Lett.* 1996, 68, 2606-2608, each of which is incorporated by reference in its entirety. Transparent LEDs can be used in applications such as a head-up display, as on a helmet visor or a vehicle windscreen. The substrate can be rigid or flexible. The substrate can be plastic, metal or glass. The first electrode can be, for example, a high work function conductor, such as an indium tin oxide (ITO) layer. Other first electrode materials can include gallium indium tin oxide, zinc indium tin oxide, titanium nitride, or polyaniline. The second electrode can be, for example, a low work function (e.g., less than 4.0 eV), metal, such as Al, Au, Ag, Ba, Yb, Ca, a lithium-aluminum alloy (Li:Al), a magnesium-silver alloy (Mg:Ag); or can be made of materials such as those described for the first electrode, i.e., ITO, gallium indium tin oxide, zinc indium tin oxide, titanium nitride, and polyaniline. The second electrode, such as Mg:Ag, can be covered with an opaque protective metal layer, for example, a layer of Ag for protecting the cathode layer from atmospheric oxidation; or covered with a relatively thin layer of substantially transparent ITO. The first electrode can have a thickness of about 500 Å to 4000 Å. The first layer can have a thickness of about 50 Å to about 5 micrometers, such as a thickness in the range of 100 Å to 100 nm, 100 nm to 1 micrometer, or 1 micrometer to 5 micrometers. The second layer can have a thickness of about 50 Å to about 5 micrometers, such as a thickness in the range of 100 Å to 100 nm, 100 nm to 1 micrometer, or 1 micrometer to 5 micrometers. The second electrode can have a thickness of about 50 Å to greater than about 1000 Å.

A dielectric layer can include a material selected for its insulating properties and compatibility with device manufacturing procedures. Some exemplary dielectric materials include, without limitation, a metal oxide (e.g., a silicon oxide such as $SiO_2$, an aluminum oxide such as $Al_2O_3$, or a hafnium oxide such as $HfO_2$), and a wide band gap polymer (e.g., polymethylmethacrylate).

The layers can be deposited on a surface of one of the electrodes by spin coating, dip coating, vapor deposition, sputtering, or other thin film deposition methods.

Conducting polymers can be grafted onto polymer substrates which contain aromatic groups using Friedel-Crafts catalysts (such as, for example, $AlCl_3$, $CuCl_2$, $FeCl_3$, or $MoCl_5$). The monomer precursors to the conducting polymer are deposited on the polymer substrate by chemical vapor deposition (CVD) while simultaneously being exposed to a oxidative catalyst. This process, termed oxidative chemical vapor deposition (oCVD), does not employ a linker, such as silane or thiol compounds, but relies on covalent bonding directly between the conducting polymer film and aromatic moiety in the polymeric substrate. Conducting polymers suitable for use in light emitting devices and can be deposited by oCVD include, for example, poly(EDOT-co-TAA) or poly (pyrrole-co-TAA).

Oxidative chemical vapor deposition (oCVD) generally takes place in a reactor. Precursor molecules, including a chemical metal-containing oxidant and a monomer species, are fed into the reactor. This process can take place at a range of pressures from atmospheric pressure to low vacuum. In certain embodiments, the pressure is about 760 torr; in other embodiments, the pressure is about 300 torr; in other embodiments, the pressure is about 30 torr; in other embodiments, the pressure is about 3000 mtorr; in yet other embodiments, the pressure is about 300 mtorr.

Chemical metal-containing oxidant species can be sublimed onto a substrate surface using a carrier gas and a heated, porous crucible installed inside the reactor directly above a sample stage. The oxidant source can also be installed on the exterior of the vacuum chamber. Evaporation of the oxidant can also take place in a resistively heated container inside the reaction chamber. In certain embodiments, evaporation of the oxidant takes place in a resistively heated container inside the reaction chamber underneath the substrate surface to be coated. In certain embodiments, the monomer species may be delivered from a source external to the reactor. The metal-containing oxidant forms a thin, conformational layer on the substrate surface, which reacts with monomer molecules as they adsorb.

Acid-catalyzed side reactions during oCVD can lead to broken monomer bonds and non-conjugated oligomers, which inhibits the formation of conjugated, electrically active polymer. However, these side reactions may be reduced using one or more the following techniques: introducing a base, such as pyridine, to react with any acid that is formed in situ; heating the substrate to temperatures above about 60° C., 70° C., 80° C. or 90° C., for example to accelerate evaporation of the acid as it is formed; and biasing the substrate with a positive charge using a DC power supply to favor the oxidation of monomeric and oligomeric species adsorbed on the substrate. Biasing also provided directionality to charged oligomers during polymer chain growth. The ordering of the polymer chains that results is expected to contribute to higher electrical conductivities.

In certain embodiments, the deposited film then may be heated, sometimes under vacuum (e.g., 15 mmHg, 30 mmHg, or 45 mmHg), to remove unreacted monomer. In certain embodiments, rinsing the dried film in a solvent like methanol or water can remove reacted metal-containing oxidant from the film, in some cases changing the color from hazy yellow to a clear sky blue hue. In certain embodiments, rinsing the dried film in a solution of "dopant" ionic salts, such as $NOPF_6$ in acetonitrile, can promote the oxidized form of a conducting polymer by balancing positive charges that are induced along the polymer chain with anions from the salt.

The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device.

The electrical properties (such as band gaps and band offsets) of the device materials can be selected in combination with the device structure to produce a device where excitons are formed preferentially on the emissive material. The emissive material can transfer energy to an emission-altering material before light is emitted from the device. Energy transfer can occur by emission of light from the emissive material and reabsorption by the emission-altering material. Alternatively, the energy transfer can be a transfer of energy without light emission and reabsorption (such as Förster energy transfer). In either case, once the emission-altering material is in an excited state, it can emit light. In some circumstances, emission and reabsorption can be the primary method of energy transfer. When this is so, the emission-altering material need not be adjacent to the emissive material. The efficiency of Förster energy transfer, however, depends on the distance between the energy transfer partners, with smaller distances giving greater efficiency of energy transfer.

Semiconductor nanocrystals can advantageously be used as an emissive and/or emission-altering material. The semiconductor nanocrystals can have a broad absorption band and an intense, narrow band emission. The peak wavelength of emission can be tuned from throughout the visible and infrared regions, depending on the size, shape, composition, and structural configuration of the nanocrystals. The nanocrystals can be prepared with an outer surface having desired chemical characteristics (such as a desired solubility or reactivity). Light emission by nanocrystals can be stable for long periods of time. Thin film light emitting devices incorporating semiconductor nanocrystals are described in, for example, Colvin, V. L., et al. *Nature* 370, 354-357 (1994); Zhao, J. et al. *Nano Lett.* 6, 463-467 (2006); Coe, S., et al. *Nature* 420, 800-803 (2002); Anikeeva, P. O., et al. *Nano Lett.* 9 (2009); Mueller, A. H. et al. *Nano Lett.* 5, 1039-1044 (2005); Caruge, J.-M., et al. *Nano Lett.* 6, 2991-2994 (2006); Bolink, H. J., et al. *Appl. Phys. Lett.* 91 223501 (2007); Stouwdam, J. W. & Janssen R. A. J. *J. Mat. Chem.* 18, 1889-1894 (2008); and Caruge, J.-M., et al. *NaturePhotonics* 2, 247-250 (2008); each of which is incorporated by reference in its entirety.

Highly efficient devices can include a monolayer of closely packed semiconductor nanocrystals and one or more organic charge transport layers; the high efficiency can be attributed to the concomitant excitation of the luminescent nanocrystal film via both Förster energy transfer and direct charge injection (see, e.g., Anikeeva, P. O., et al. *Phys. Rev. B* 78, 085434 (2008), which is incorporated by reference in its entirety). Because of the dominant role of Förster energy transfer in device operation, for a particular exciton-donating film, red-emitting devices can operate with greater efficiency than blue devices (see, for example, Anikeeva, P. O., et al. *Nano Lett.* 9 (2009); and Anikeeva, P. O. et al. *Nano Lett.* 7, 2196-2200 (2007); each of which is incorporated by reference in its entirety).

When a nanocrystal achieves an excited state (or in other words, an exciton is located on the nanocrystal), emission can occur at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) for nanocrystals that emit in the visible can be observed. IR-emitting nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or greater than 80%.

Colloidal nanocrystals can be doped with transition metals (such as Fe, Ni, Mn, or Cu) and lanthanides (such as Eu, Er, Tm, or Tb) to alter their electronic, optical, and/or magnetic properties. See, for example, Alivisatos A. P. *Science* 1996, 271, 933; Shim M.; Guyot-Sionnest P. *Nature* 2000, 407, 981; Levy L., et al.; *J. Phys. Chem.* 1996, 100, 18322; Hanif K. M., et al.; *J. Am. Chem. Soc.* 2002, 122, 2532; Wang Y., et al.; *Solid State Comm.* 1991, 77, 33; and Norris D. J., et al.; *Nano Lett.* 2007, 1, 3; each of which is incorporated by reference in its entirety. Light emission from doped nanocrystals can be independent of the band gap of the host material, and largely unaffected by thermal and chemical variations of the surrounding medium (see, e.g., Pradhan N., et al.; *J. Amer. Chem. Soc.* 2005, 127, 17528, which is incorporated by reference in its entirety).

The semiconductor forming the nanocrystals can include a Group II-VI compound, a Group II-V compound, a Group III-VI compound, a Group III-V compound, a Group IV-VI compound, a Group I-III-VI compound, a Group II-IV-VI compound, or a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. Nos. 6,322,901, 6,576,291, and 7,253,452, each of which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl)chalcogenide, dioxygen, an ammonium salt, or a tris(silyl)pnictide. Suitable X donors include dioxygen, bis(trimethylsilyl)selenide ((TMS)$_2$Se), trialkyl phosphine selenides such as (tri-n-octylphosphine)selenide (TOPSe) or (tri-n-butylphosphine)selenide (TBPSe), trialkyl phosphine tellurides such as (tri-n-octylphosphine)telluride (TOPTe) or hexapropylphosphorustriamide telluride (HPPTTe), bis(trimethylsilyl)telluride ((TMS)$_2$Te), bis(trimethylsilyl)sulfide ((TMS)$_2$S), a trialkyl phosphine sulfide such as (tri-n-octylphosphine)sulfide (TOPS), an ammonium salt such as an ammonium halide (e.g., NH$_4$Cl), tris(trimethylsilyl)phosphide ((TMS)$_3$P), tris (trimethylsilyl)arsenide ((TMS)$_3$As), or tris(trimethylsilyl) antimonide ((TMS)$_3$Sb). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, or amines may also be suitable for the nanocrystal production. Examples of suitable coordinating solvents include pyridine, tri-n-octyl phosphine (TOP), tri-n-octyl phosphine oxide (TOPO) or tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

Doped nanocrystals can be prepared by a method like the one described in Thakar et al.; *Nano Lett.* 2007, 7, 3429, which is incorporated by reference in its entirety. Generally, a nanocrystal of a given size and composed of a particular material can be surface doped, e.g., with a transition metal, and the nanocrystal grown to a larger size by addition of the same material. Alternatively, a nanocrystal of a given size and composed of a particular material can be coated first with a thin coating layer by exposure to coating reagents in the presence of a doping reagent, and then the coating thickness increased by exposure to coating reagents without added doping reagent. See also Alivisatos A. P. *Science* 1996, 271, 933; Shim M.; Guyot-Sionnest P. *Nature* 2000, 407, 981; Levy L., et al.; *J. Phys. Chem.* 1996, 100, 18322; Hanif K. M., et al.; *J. Am. Chem. Soc.* 2002, 122, 2532; Wang Y., et al.; *Solid State Comm.* 1991, 77, 33; Norris D. J., et al.; *Nano Lett.* 2007, 1, 3; Pradhan N., et al.; *J. Amer. Chem. Soc.* 2005, 127, 17528; and Pradhan N.; Peng X. *J. Amer. Chem. Soc.* 2006, 129, 3339, each of which is incorporated by reference in its entirety.

The core can have an overcoating on a surface of the core. The overcoating can be a semiconductor material having a composition different from the composition of the core. The overcoat of a semiconductor material on a surface of the nanocrystal can include a Group II-VI compound, a Group II-V compound, a Group III-VI compound, a Group III-V compound, a Group IV-VI compound, a Group I-III-VI compound, a Group II-IV-VI compound, and a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include compounds derived from the coordinating solvent used during the growth process. The surface can be modified by repeated exposure to an excess of a competing coordinating group. For example, a dispersion of the capped nanocrystal can be treated with a coordinating organic compound, such as pyridine, to produce crystallites which disperse readily in pyridine, methanol, or aromatics but no longer disperse in aliphatic solvents. Such a surface exchange process can be carried out with any compound capable of coordinating to or bonding with the outer surface of the nanocrystal, including, for example, phosphines, thiols, amines or phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal coordinating compounds are described, for example, in U.S. Pat. No. 6,251,303, which is incorporated by reference in its entirety.

More specifically, the coordinating ligand can have formula (I):

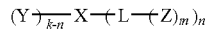

wherein k is 2, 3 or 5; n is 1, 2, 3, 4 or 5, provided that k−n is not less than zero; and m is 1 or 2, 3, 4, 5, 6, 7, 8, 9, or 10;

X is O, S, S=O, $SO_2$, Se, Se=O, N, N=O, P, P=O, As, or As=O;

each of Y and L, independently, is an aryl group, a heteroaryl group, or a straight or branched $C_{2-12}$ hydrocarbon chain optionally containing at least one double bond, at least one triple bond, or at least one double bond and one triple bond; wherein the aryl group, the heteroaryl group, or the hydrocarbon chain is optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, monocyclic aryl, 5-6 membered heteroaryl, $C_{1-4}$ alkylcarbonyloxy, $C_{1-4}$ alkyloxycarbonyl, $C_{1-4}$ alkylcarbonyl, or formyl; and the hydrocarbon chain is optionally interrupted by —O—, —S—, —N($R^e$)—, —N($R^e$)—C(O)—O—, —O—C(O)—N($R^e$)—, —N($R^e$)—C(O)—N($R^f$)—, —O—C(O)—O—, —P($R^e$)—, or —P(O)($R^e$)—;

each of $R^e$ and $R^f$, independently, is hydrogen, alkyl, alkenyl, alkynyl, alkoxy, hydroxylalkyl, hydroxyl, or haloalkyl; and Z is hydroxy, sulfhydryl, sulfinate, sulfinic acid, sulfonate, sulfonic acid, disulfide, carboxyl, carboxylate, amine, amide, —OC(O)—$CH_2$—CH=$CH_2$, —OC(O)—$CH_2$—C($CH_3$)=$CH_2$, alkoxysilyl, halosilyl, phosphate, phosphonic acid, phosphonate ester, phosphinate, phosphinic acid, or phosphinate ester.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, or phenanthryl.

A suitable coordinating ligand can be purchased commercially or prepared by ordinary synthetic organic techniques, for example, as described in J. March, *Advanced Organic Chemistry*, which is incorporated by reference in its entirety. Some coordinating ligands suitable for use with semiconductor nanocrystals are described in, for example, U.S. Pat. Nos. 7,160,613, 7,190,870, and 6,444,143, each of which is incorporated by reference in its entirety.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

Individual devices can be formed at multiple locations on a single substrate to form a display. The display can include devices that emit at different wavelengths. By patterning the substrate with arrays of different color-emitting materials, a display including pixels of different colors can be formed. In some applications, the substrate can include a backplane. The backplane includes active or passive electronics for controlling or switching power to individual pixels. Include a backplane can be useful for applications such as displays, sensors, or imagers. In particular, the backplane can be configured as an active matrix, passive matrix, fixed format, direct drive, or hybrid. The display can be configured for still images, moving images, or lighting. A lighting display can provide white light, monochrome light, or color-tunable light. See, e.g., U.S. Patent Application Publication No. 2006-0196375, which is incorporated by reference in its entirety.

The device can be made in a controlled (oxygen-free and moisture-free) environment, preventing the quenching of luminescent efficiency during the fabrication process. Other multilayer structures may be used to improve the device performance.

The performance of light emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Nanocrystals can be included in efficient hybrid organic/inorganic light emitting devices.

The narrow FWHM of nanocrystals can result in saturated color emission. This can lead to efficient nanocrystal-light emitting devices even in the red and blue parts of the visible spectrum, since in nanocrystal emitting devices no photons are lost to infrared and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of nanocrystals will emit light spanning a narrow range of wavelengths. A device including more than one size and/or composition of nanocrystal can emit light in more than one narrow range of wavelengths. The color of emitted light perceived by a viewer can be controlled by selecting appropriate combinations of nanocrystal sizes and materials in the device. The degeneracy of the band edge energy levels of nanocrystals facilitates capture and radiative recombination of all possible excitons, whether generated by direct charge injection, energy transfer, or absorption of light.

Devices can be prepared that emit visible or infrared light. The size and material of a semiconductor nanocrystal can be selected such that the nanocrystal emits visible or infrared light of a selected wavelength. The wavelength can be between 300 and 2,500 nm or greater, for instance between 300 and 400 nm, between 400 and 700 nm, between 700 and 1100 nm, between 1100 and 2500 nm, or greater than 2500 nm.

Individual devices can be formed at multiple locations on a single substrate to form a display. The display can include devices that emit at different wavelengths. By patterning the substrate with arrays of different color-emitting semiconductor nanocrystals, a display including pixels of different colors can be formed.

The device can be made in a controlled (oxygen-free and moisture-free) environment, preventing the quenching of luminescent efficiency during the fabrication process. Other multilayer structures may be used to improve the device performance (see, for example, U.S. Pat. No. 7,332,211 and U.S. Patent Application Publication No. 2004/0023010, each of which is incorporated by reference in its entirety). A blocking layer, such as an electron blocking layer (EBL), a hole blocking layer (HBL) or a hole and electron blocking layer (eBL), can be introduced in the structure. A blocking layer can include 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4''-tris{N-(3-methylphenyl)-N-phenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl]benzene.

The HLED devices can be manufactured in bulk. After a hole transporting layer is deposited, further materials may be deposited by ink jet printing, e.g., directly on to the substrate or via roll-to-roll processing. Water soluble linkers, semiconductor nanocrystals, and cathode materials can be selected so as to avoid the use of organic solvents. Water can be a desirable solvent for several reasons, including low cost, ready availability, compatibility with HLED materials and manufacturing (e.g., compatibility with a wide variety of substrate and charge transport materials), and environmental concerns. Masking steps can be omitted from the manufacturing process, because patterns may be created simply in the ink jet printing steps. High vacuum processes can also be avoided; the process can involve only ambient or moderate vacuum conditions. Cost savings can also be achieved because ink jet printing, being an additive process, avoids material waste as can occur during, for example, spin casting.

All the reactions involved in the fabrication of inorganic-organic hybrid LEDs could be performed using aqueous solutions. Hence, these solutions could be used to print the molecular linkers and semiconductor nanocrystals on the substrates for the fabrication of HLEDs. Initially, a layer of a linker (e.g., p-phenylenediamine) is printed on top of a charge transporting layer (e.g., a hole-transporting conductive polymer). This is followed by printing semiconductor nanocrystals with different emission wavelengths (for example, red, green and blue, to provide full color and/or white light emission). Finally, colloidal gold nanoparticles can be printed, to function as the cathode in the device. All the printing steps are optimized and the concentration of solutions required for obtaining smooth uniform layers of nanocrystals and gold nanoparticles can be readily determined by routine experimentation by one skilled in the art.

The applied voltage used for light generation can be an AC voltage or DC voltage. A DC voltage can be supplied by DC voltage generator, including, for example, a battery, a capacitor, or a rectified AC voltage. An AC voltage can be supplied by an AC voltage generator which produces a voltage waveform, such as, for example, a square wave. The waveform can have a frequency of between 0.01 Hz and 100 kHz, 10 Hz and 1 MHz, 250 Hz and 100 kHz, or 500 Hz and 10 kHz. The average voltage can be between 2 and 15 volts, or 3 and 8 volts. The percentage of duty cycle used is the calculated as one hundred multiplied by the average voltage divided by the maximum voltage. The percentage of duty cycle is the relative time in an on/off cycle (in %) during which the voltage is on. The frequency, duty cycle, and peak voltage can be adjusted to optimize light output and stability from the device. Some applications of a duty cycle are described, for example, in G. Yu et al. Applied Physics Letters 73:111-113 (1998), incorporated herein by reference in its entirety. For example, the AC voltage waveform can be a 50% duty cycle at 5 V and 1 kHz, which has a maximum voltage of 5 volts, a frequency of 1 kHz, and an average voltage of 2.5 volts. In this way, a low average operating voltage can improve the operating half-lives of the devices.

A display unit can be made using such electroluminescent devices comprising a layer including a nanocrystal layer and wide band gap material between two insulating layers and conductive layers, wherein the light emitting layer generating light of different colors is formed by choosing and patterning nanocrystal layers of desired energy structure and composition. Thus, a multicolor display can be realized.

EXAMPLES

Device substrates (ITO-coated glass) were cleaned in oxygen plasma for 5 minutes followed by immersion in a 5 wt % solution of thiophene acetic acid (TAA) in methanol. The TAA became chemisorbed on the ITO. and led to the formation of a copolymer film grafted to the substrate.

A hole transporting layer of poly(EDOT-co-TAA) conducting polymer was deposited by oCVD on an ITO-coated glass substrate. Iron (III) chloride was the oxidant. Deposition by oCVD is described in, for example, Vaddiraju et al., *Adv. Funct. Mater.* 2008, 19, 1929; Lock et al., *Macromolecules* 2006, 39, 5326; Im et al., *Macromolecules* 2007, 40, 6552; Im et al, *Adv. Mat.* 2007, 19, 2863; Armstrong et al., *Thin Solid Films* 2003, 445, 342; and WO 2008/118534, each of which is incorporated by reference in its entirety. The hole transporting layer was then washed with copious amounts of methanol to remove any excess oxidizing agent. The films were next annealed in air at 100° C. for 10 minutes.

Following the conducting polymer deposition process, the films were treated with an aqueous solution of p-phenylenediamine. Pendant —COOH groups of the conducting polymer reacted with one of the —$NH_2$ groups of the p-phenylenediamine. This procedure resulted in a conducting polymer hole transporting layer with a conjugated linker on top of it, the linker including free —$NH_2$ groups available for further reactions.

Commercially available CdSe/ZnS nanocrystals coordinated by mercaptoundecanoic acid were treated with a 0.01 N solution of 4-mercaptobenzoic acid for 24 hours. Thiol exchange resulted in water soluble nanocrystals bearing free —COOH groups.

The nanocrystals were attached to the conducting polymer layer via free —$NH_2$ groups using the well-known 1-ethyl-3-(3-dimethylaminopropyl)carbodiimide (EDC) chemistry, which promotes formation of amide bonds between amine and carboxylic acid groups. A 0.01 M solution of EDC in water was used, for 2 to 4 hours and at room temperature in air. To this point, water was the only solvent used for the steps after the methanol rinse. Finally, a layer of gold was deposited on top of the quantum dot layer. A 30 nm-thick film of gold was deposited using a sputter coater at room temperature.

Figure 3:
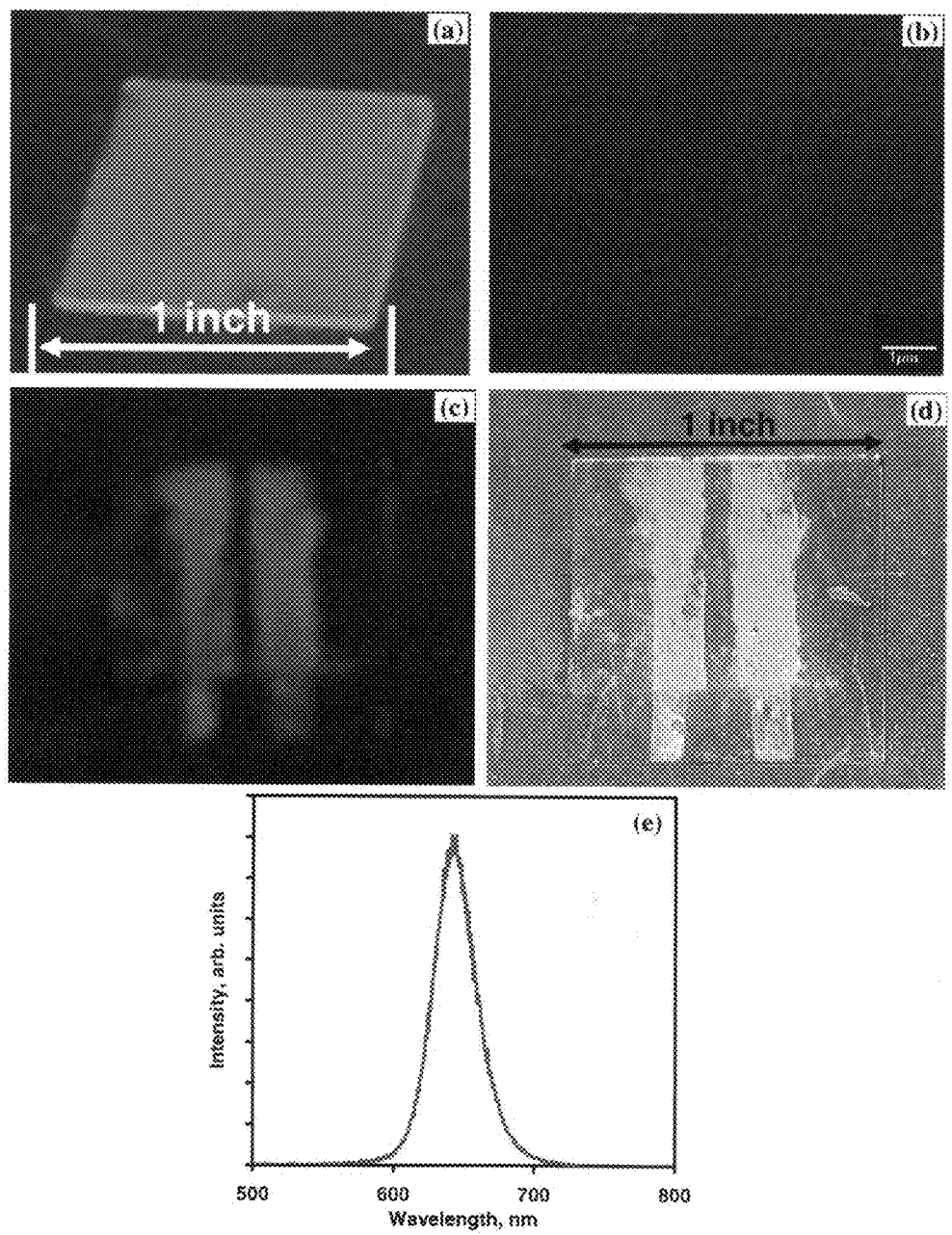
FIG. 3A is an optical micrograph showing uniform assembly of nanocrystals on poly(EDOT-co-TAA) over an area of 1 inch². Picture was obtained under UV illumination using a handheld UV lamp with a wavelength of 365 nm.
FIG. 3B is a scanning electron micrograph of the nanocrystal assembly showing that the nanocrystal layer is free of both pinholes and defects.
FIGS. 3C-3D are optical micrographs recorded under (FIG. 3C) UV illumination or (FIG. 3D) room light, demonstrating patternability of the conducting polymer film and hence the nanocrystal assembly.
FIG. 3E is a photoluminescence spectrum of nanocrystals assembled on a poly(EDOT-co-TAA) film.

The uniformity of the semiconductor nanocrystal assembly on top of poly(EDOT-co-TAA) layer was verified using UV luminance (FIG. 3A) and scanning electron microscopy (FIG. 3B). Under UV illumination, a uniform red luminescence was observed from an area of 1 inch$^2$. The uniform luminescence indicated that the nanocrystals were attached over the entire area of the conducting polymer. Scanning electron microscopy (SEM) of the samples revealed neither pin holes nor defects in the nanocrystal layer (FIG. 3B). Presence of pin holes would lead to a short-circuited device after deposition of the cathode metal.

It was also possible to pattern nanocrystals on ITO-coated glass by first patterning the ITO. Two 3.6 mm strips of ITO spaced 1 cm apart were masked using scotch tape. The remaining exposed ITO layer was etched with piranha solution. The two strips of ITO remaining were then subjected to oCVD and nanocrystal deposition as described above. An optical micrograph of the resulting structure under room light illumination is shown in FIG. 3D. FIG. 3C is an optical micrograph of the same structure under UV illumination which revealed that the assembly of nanocrystals occurred only on top of the regions comprising the conducting polymer films and not on glass.

A photoluminescence (PL) spectrum (FIG. 3E) of the nanocrystal assembly showed a peak at 641 nm. The peak emission of the nanocrystals in solution was 636 nm. This result indicated that the quantum dots did not coalesce on top of the conducting polymer film after assembly.

Figure 4:
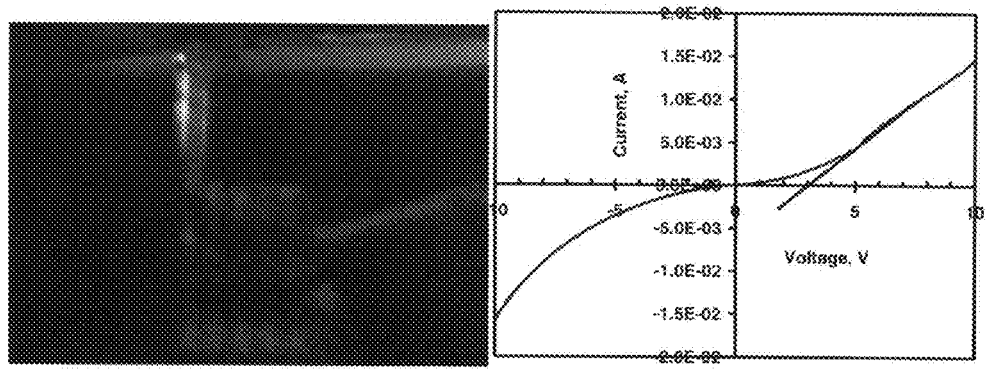
FIG. 4A is an optical micrograph showing electroluminescence from an area of 7.2 mm² at an applied voltage of 7 V.
FIG. 4B is a graph depicting current-voltage characteristics of the LED shown in FIG. 4A. The threshold voltage was 3 V.

Following deposition of gold using a sputter coater, the LED was tested under applied bias. Under applied bias, a luminance was observed form an area of 7.2 mm$^2$ (FIG. 4A). The threshold voltage required for light emission from the device was 3 V. This was reiterated by current-voltage characteristic curve obtained from the device (FIG. 4B). Light emission in excess of 1660 Cd/m$^2$ could be obtained from the LED at an applied voltage of 7 V. The external quantum efficiency was 1.29%. The luminous and power efficiencies of the devices were 2.31 Cd/A and 2.45 lm/W, respectively. For the fabrication of a commercial red LED, a brightness of 500 Cd/m$^2$ at a power efficiency of 10 Cd/A are required. The light emission form our device exceeded the commercially required 500 Cd/m$^2$. See, for example, M. S. Weaver, "Vapor-Deposited organic light-emitting devices" in Zhigang Li, Hong Meng, (Eds.) "Organic light emitting materials and devices", Taylor and Francis, 2007, which is incorporated by reference in its entirety. The device was stored under ambient conditions and the intermittently tested over a period of more than one month. The device did not degrade during this time; the above efficiency data was obtained from the device after a period of one month of intermittent use.

Figure 5:
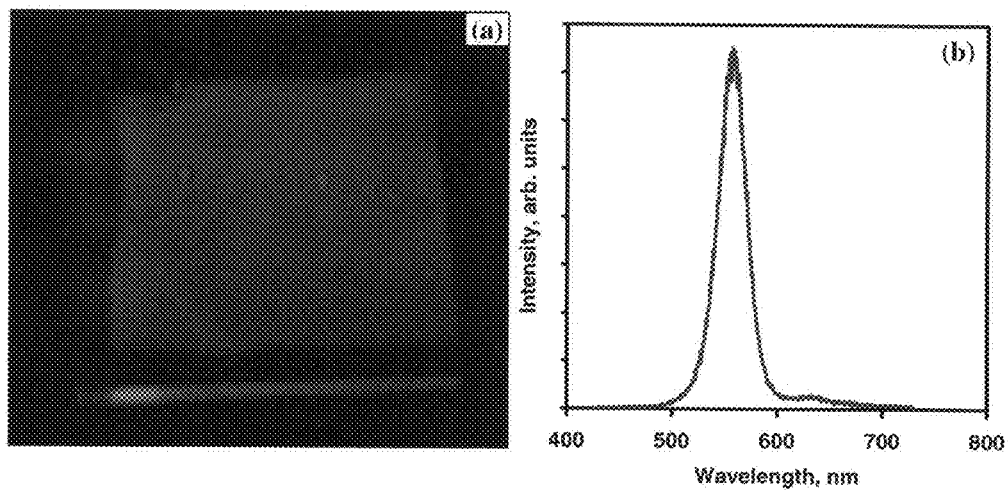
FIG. 5A is an optical micrograph showing uniform assembly of green-emitting nanocrystals on a poly(EDOT-co-TAA) film over an area of 1 inch². Picture was obtained under UV illumination using a handheld UV lamp with a wavelength of 365 nm.
FIG. 5B is a photoluminescence spectrum of nanocrystals assembled on a poly(EDOT-co-TAA) film.

A uniform assembly of green-emitting nanocrystals was prepared on a conducting poly(EDOT-co-TAA) film, using the same p-phenylenediamine and 4-thiobenzoic acid chemistry as described above. FIG. 5A shows uniform photoluminesce from a 1 inch$^2$ region of the assembly. The photoluminescence spectrum (FIG. 5B) of this assembly showed a peak light emission at 557 nm, with a full width at half maximum (FWHM) of 30 nm. The peak emission of the nanocrystals in solution was 546 nm with a full width at half maximum of 30 nm. Thus, the nanocrystal size distribution was not changed during the integration process and further indicated a coalescence-free assembly of semiconductor nanocrystals on the conducting polymer film.

Other embodiments are within the scope of the following claims.

What is claimed is:

1. A light emitting device comprising:
   a first electrode and a second electrode spaced apart from the first electrode;
   a first charge transport material adjacent to the first electrode;
   a layer disposed between the first and second electrodes, the layer including a plurality of semiconductor nanocrystals;
   a first linking moiety having a first end covalently bonded to the first charge transport material and a second end coordinated to a semiconductor nanocrystal; and
   a second linking moiety having a first end coordinated to a semiconductor nanocrystal.

2. The device of claim 1, wherein the first charge transport material, the first linking moiety, the semiconductor nanocrystal, and the second linking moiety together provide a continuous chain of covalent bonds extending from the first electrode to the second electrode.

3. The device of claim 2, wherein the first linking moiety provides a continuous chain of π-conjugated covalent bonds extending from the first electrode to the semiconductor nanocrystal.

4. The device of claim 3, wherein the second linking moiety provides a continuous chain of π-conjugated covalent bonds extending from the semiconductor nanocrystal to the second electrode.

5. The device of claim 1, further comprising a second charge transport material adjacent to the second electrode.

6. The device of claim 5, wherein the second linking moiety has a second end covalently bonded to the second charge transport material.

7. The device of claim 1, wherein the first linking moiety includes a nanocrystal-coordinating region.

8. The device of claim 7, wherein the nanocrystal-coordinating region of the first linking moiety includes

-X-L- wherein X is O, S, S=O, $SO_2$, Se, Se=O, N, N=O, P, P=O, As, or As=O;

L is an aryl group, a heteroaryl group, or a straight or branched $C_{2-12}$ hydrocarbon chain optionally containing at least one double bond, at least one triple bond, or at least one double bond and one triple bond; wherein the aryl group, the heteroaryl group, or the hydrocarbon chain is optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, monocyclic aryl, 5-6 membered heteroaryl, $C_{1-4}$ alkylcarbonyloxy, $C_{1-4}$ alkyloxycarbonyl, $C_{1-4}$ alkylcarbonyl, or formyl; and the hydrocarbon chain is optionally interrupted by —O—, —S—, —N($R^e$)—, —N($R^e$)—C(O)—O—, —O—C(O)—N($R^e$)—, —N($R^e$)—C(O)—N($R^f$)—, —O—C(O)—O—, —P($R^e$)—, or —P(O)($R^e$)—; and each of $R^e$ and $R^f$, independently, is hydrogen, alkyl, alkenyl, alkynyl, alkoxy, hydroxylalkyl, hydroxyl, or haloalkyl.

9. The device of claim 8, wherein X is S, and L is —Ar—C(O)—.

10. The device of claim 8, wherein X is S, and L is

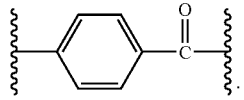

11. The device of claim 8, wherein the second linking moiety includes a nanocrystal-coordinating region.

12. The device of claim 11, wherein the nanocrystal-coordinating region of the second linking moiety includes

-X-L- wherein X is O, S, S=O, $SO_2$, Se, Se=O, N, N=O, P, P=O, As, or As=O;

L is an aryl group, a heteroaryl group, or a straight or branched $C_{2-12}$ hydrocarbon chain optionally containing at least one double bond, at least one triple bond, or at least one double bond and one triple bond; wherein the aryl group, the heteroaryl group, or the hydrocarbon chain is optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, monocyclic aryl, 5-6 membered heteroaryl, $C_{1-4}$ alkylcarbonyloxy, $C_{1-4}$ alkyloxycarbonyl, $C_{1-4}$ alkylcarbonyl, or formyl; and the hydrocarbon chain is optionally interrupted by —O—, —S—, —N($R^e$)—, —N($R^e$)—C(O)—O—, —O—C(O)—N($R^e$)—, —N($R^e$)—C(O)—N($R^f$)—, —O—C(O)—O—, —P($R^e$)—, or —P(O)($R^e$)—; and each of $R^e$ and $R^f$, independently, is hydrogen, alkyl, alkenyl, alkynyl, alkoxy, hydroxylalkyl, hydroxyl, or haloalkyl.

13. The device of claim 12, wherein the nanocrystal-coordinating region of the first linking moiety is chemically identical to the nanocrystal-coordinating region of the second linking moiety.

14. The device of claim 1, wherein the first charge transport material includes a copolymer including EDOT monomer units.

15. The device of claim 14, wherein the first charge transport material includes poly(EDOT-co-TAA).

16. The device of claim 1, wherein the first linking moiety includes —$NR^a$—Ar—$NR^a$—, wherein Ar is an optionally substituted aryl or heteroaryl group, and each $R^a$, independently, is hydrogen, alkyl, alkenyl, alkynyl, alkoxy, hydroxylalkyl, hydroxyl, haloalkyl, aryl, or heteroaryl.

17. The device of claim 16, wherein the first linking moiety includes

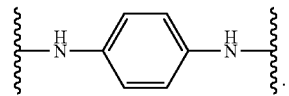

18. The device of claim 1, wherein the second linking moiety includes a metal-coordinating region.

19. The device of claim 18, wherein the second electrode includes a metal, and the metal-coordinating region of the second linking moiety is coordinated to the metal.

20. The device of claim 19, wherein the metal-coordinating region of the second linking moiety includes —OH.

21. A method of generating light comprising:
providing a device including:
a first electrode and a second electrode spaced apart from the first electrode;
a first charge transport material adjacent to the first electrode;
a layer disposed between the first and second electrodes, the layer including a plurality of semiconductor nanocrystals;
a first linking moiety having a first end covalently bonded to the first charge transport material and a second end coordinated to a semiconductor nanocrystal; and
a second linking moiety having a first end coordinated to a semiconductor nanocrystal; and
applying a light-generating potential across the first electrode and the second electrode.

22. The method of claim 21, wherein the first charge transport material, the first linking moiety, the semiconductor nanocrystal, and the second linking moiety together provide a continuous chain of covalent bonds extending from the first electrode to the second electrode.

23. The method of claim 22, wherein the first linking moiety provides a continuous chain of π-conjugated covalent bonds extending from the first electrode to the semiconductor nanocrystal.

24. The method of claim 23, wherein the second linking moiety provides a continuous chain of π-conjugated covalent bonds extending from the semiconductor nanocrystal to the second electrode.

25. The method of claim 21, further comprising a second charge transport material adjacent to the second electrode.

26. The method of claim 25, wherein the second linking moiety has a second end covalently bonded to the second charge transport material.

27. The method of claim 21, wherein the first linking moiety includes a nanocrystal-coordinating region.

28. The method of claim 27, wherein the nanocrystal-coordinating region of the first linking moiety includes

-X-L- wherein X is O, S, S=O, $SO_2$, Se, Se=O, N, N=O, P, P=O, As, or As=O;

L is an aryl group, a heteroaryl group, or a straight or branched $C_{2-12}$ hydrocarbon chain optionally containing at least one double bond, at least one triple bond, or at least one double bond and one triple bond; wherein the aryl group, the heteroaryl group, or the hydrocarbon chain is optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, monocyclic aryl, 5-6 membered heteroaryl, $C_{1-4}$ alkylcarbonyloxy, $C_{1-4}$ alkyloxycarbonyl, $C_{1-4}$ alkylcarbonyl, or formyl; and the hydrocarbon chain is optionally interrupted by —O—, —S—, —N(R$^e$)—, —N(R$^e$)—C(O)—O—, —O—C(O)—N(R$^e$)—, —N(R$^e$)—C(O)—N(R$^f$)—, —O—C(O)—O—, —P(R$^e$)—, or —P(O)(R$^e$)—; and each of R$^e$ and R$^f$, independently, is hydrogen, alkyl, alkenyl, alkynyl, alkoxy, hydroxylalkyl, hydroxyl, or haloalkyl.

29. The method of claim 28, wherein X is S, and L is —Ar—C(O)—.

30. The method of claim 28, wherein X is S, and L is

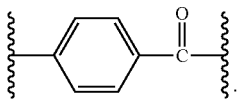

31. The method of claim 28, wherein the second linking moiety includes a nanocrystal-coordinating region.

32. The method of claim 31, wherein the nanocrystal-coordinating region of the second linking moiety includes

-X-L- wherein X is O, S, S=O, SO$_2$, Se, Se=O, N, N=O, P, P=O, As, or As=O;

L is an aryl group, a heteroaryl group, or a straight or branched C$_{2-12}$ hydrocarbon chain optionally containing at least one double bond, at least one triple bond, or at least one double bond and one triple bond; wherein the aryl group, the heteroaryl group, or the hydrocarbon chain is optionally substituted with one or more C$_{1-4}$ alkyl, C$_{2-4}$ alkenyl, alkynyl, C$_{1-4}$ alkoxy, hydroxyl, halo, amino, nitro, cyano, C$_{3-5}$ cycloalkyl, 3-5 membered heterocycloalkyl, monocyclic aryl, 5-6 membered heteroaryl, C$_{1-4}$ alkylcarbonyloxy, C$_{1-4}$ alkyloxycarbonyl, C$_{1-4}$ alkylcarbonyl, or formyl; and the hydrocarbon chain is optionally interrupted by —O—, —S—, —N(R$^e$)—, —N(R$^e$)—C(O)—O—, —O—C(O)—N(R$^e$)—, —N(R$^e$)—C(O)—N(R$^f$)—, —O—C(O)—O—, —P(R$^e$)—, or —P(O)(R$^e$)—; and each of R$^e$ and R$^f$, independently, is hydrogen, alkyl, alkenyl, alkynyl, alkoxy, hydroxylalkyl, hydroxyl, or haloalkyl.

33. The method of claim 32, wherein the nanocrystal-coordinating region of the first linking moiety is chemically identical to the nanocrystal-coordinating region of the second linking moiety.

34. The method of claim 31, wherein the first charge transport material includes a copolymer including EDOT monomer units.

35. The method of claim 34, wherein the first charge transport material includes poly(EDOT-co-TAA).

36. The method of claim 31, wherein the first linking moiety includes —NR$^a$—Ar—NR$^a$—, wherein Ar is an optionally substituted aryl or heteroaryl group, and each R$^a$, independently, is hydrogen, alkyl, alkenyl, alkynyl, alkoxy, hydroxylalkyl, hydroxyl, haloalkyl, aryl, or heteroaryl.

37. The method of claim 16, wherein the first linking moiety includes

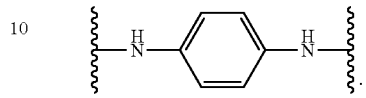

38. The method of claim 21, wherein the second linking moiety includes a metal-coordinating region.

39. The method of claim 38, wherein the second electrode includes a metal, and the metal-coordinating region of the second linking moiety is coordinated to the metal.

40. The method of claim 39, wherein the metal-coordinating region of the second linking moiety includes —OH.

41. A method of making a light emitting device, comprising:
depositing a first charge transport material over a first electrode; and
depositing a plurality of semiconductor nanocrystals over the first charge transport material, the semiconductor nanocrystals including a coordinating ligand having a nanocrystal-coordinating region and a first reactive functional group; and
depositing a second electrode over the plurality of semiconductor nanocrystals.

42. The method of claim 41, wherein depositing the first charge transport material includes oCVD.

43. The method of claim 41, further comprising modifying the first charge transport material with a spacer moiety having a second reactive functional group.

44. The method of claim 43, wherein modifying the first charge transport material includes forming a covalent bond between the first charge transport material and the spacer moiety.

45. The method of claim 43, wherein the first reactive functional group and the second reactive functional group react, thereby forming a covalent bond between the spacer moiety and the coordinating ligand.

46. The method of claim 41, wherein the semiconductor nanocrystals include a coordinating ligand having a metal-coordinating region.

47. The method of claim 41, wherein depositing the second electrode includes depositing a plurality of colloidal metal nanoparticles.

* * * * *

UNITED STATES PATENT AND TRADEMARK OFFICE
CERTIFICATE OF CORRECTION

| | | |
|---|---|---|
| PATENT NO. | : 8,106,420 B2 | Page 1 of 1 |
| APPLICATION NO. | : 12/479181 | |
| DATED | : January 31, 2012 | |
| INVENTOR(S) | : Karen K. Gleason et al. | |

It is certified that error appears in the above-identified patent and that said Letters Patent is hereby corrected as shown below:

Title page, at item (75), correct the inventors to be:

-- (75) Inventors: Karen K. Gleason, Cambridge, MA (US); Sreeram Vaddiraju (US). --.

Signed and Sealed this
Second Day of July, 2013

Teresa Stanek Rea
*Acting Director of the United States Patent and Trademark Office*